United States Patent [19]

Lane et al.

[11] Patent Number: 5,481,185
[45] Date of Patent: Jan. 2, 1996

[54] SOLENOID, TYPE VOLTAGE, POLARITY AND CONTINUITY TESTER

[75] Inventors: Peter B. Lane, Thiensville; William M. Hinz, Twin Lakes, both of Wis.

[73] Assignee: GB Electrical Inc., Milwaukee, Wis.

[21] Appl. No.: 349,711

[22] Filed: Dec. 5, 1994

[51] Int. Cl.[6] ................................................. G01R 19/00
[52] U.S. Cl. ..................... 324/145; 324/133; 324/556; 324/115
[58] Field of Search ................................ 324/73.1, 115, 324/145, 146, 133, 555, 556

[56] References Cited

U.S. PATENT DOCUMENTS

| | | |
|---|---|---|
| 2,290,760 | 7/1942 | Mehaffie . |
| 2,524,841 | 10/1950 | Simkins ................................... 324/145 |
| 3,231,816 | 1/1966 | Oehlerking . |
| 3,304,498 | 2/1967 | Myers . |
| 3,416,074 | 12/1968 | Schoonover . |
| 3,513,393 | 5/1970 | Myers . |
| 4,127,807 | 11/1978 | Peplow et al. . |
| 4,127,810 | 11/1978 | Purland . |
| 4,214,200 | 7/1980 | Hollander . |
| 4,238,728 | 12/1980 | Wells, Jr. et al. . |
| 4,280,092 | 7/1981 | Wells, Jr. et al. . |
| 4,503,390 | 3/1985 | Wells, Jr. . |
| 4,797,604 | 1/1989 | Rocci et al. . |
| 4,825,150 | 4/1989 | Sirasud ................................... 324/133 |

FOREIGN PATENT DOCUMENTS

| | | |
|---|---|---|
| 590017 | 1/1960 | Canada . |
| 318368 | 9/1929 | United Kingdom . |
| 1192563 | 5/1970 | United Kingdom . |

Primary Examiner—Kenneth A. Wieder
Assistant Examiner—Jose M. Solis
Attorney, Agent, or Firm—Quarles & Brady

[57] ABSTRACT

A solenoid type voltage, polarity and continuity tester has a solenoid operated voltage indicator, and separate positive polarity, negative polarity and continuity indicators. In the circuit for the tester, the solenoid is arranged in series with the polarity and continuity indication circuits so that continuity of the solenoid can be verified when the continuity of a circuit being checked is positively determined. A polarity indication circuit is in parallel with a continuity indication circuit. The continuity circuit has a battery which is switched into a circuit having a high resistance when a voltage is applied to the tester to reduce battery drainage.

8 Claims, 5 Drawing Sheets

FIG. 2
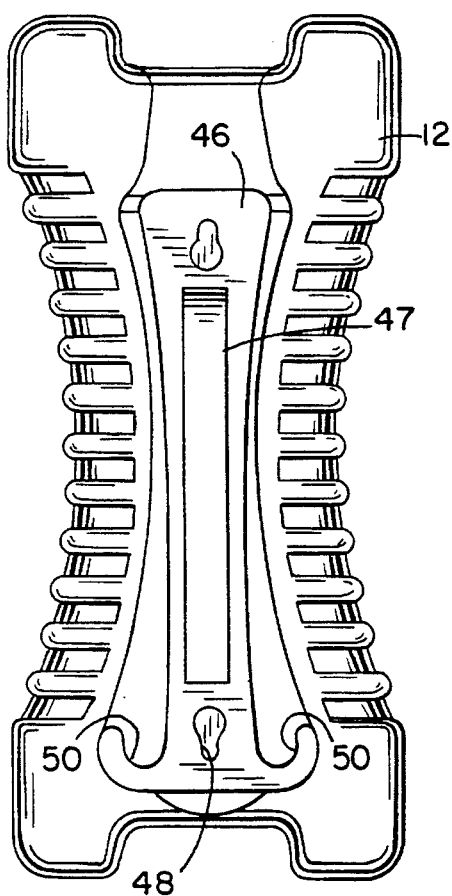
FIG. 3
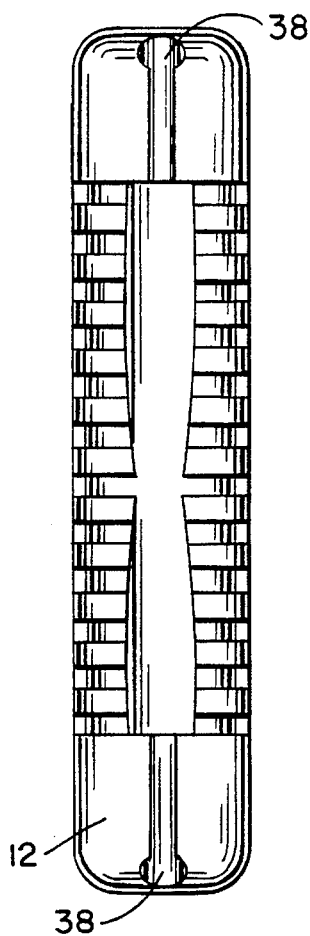
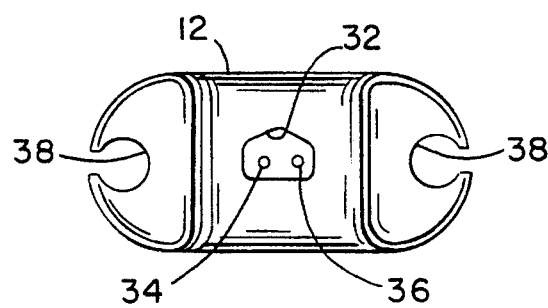
FIG. 4
FIG. 5
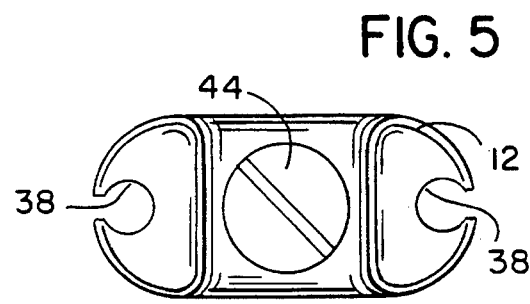

5,481,185

SOLENOID, TYPE VOLTAGE, POLARITY AND CONTINUITY TESTER

BACKGROUND OF THE INVENTION

1. Field of the Invention

This invention relates to electrical meters, and in particular to solenoid type voltage, polarity and continuity meters or testers.

2. Discussion of the Prior Art

Solenoid type voltage polarity and continuity testers are well known. They are preferred in many applications by electricians because they are capable of measuring a large range of voltages, either AC or DC, and because the solenoid movement of such meters is rugged. One such meter is disclosed in U.S. Pat. No. 4,503,390. In the circuit of this meter, the solenoid and a threshold voltage device in series with the solenoid are in parallel with the circuit which performs the polarity and continuity indicating functions. Two batteries are provided with a ground between the batteries and the same light emitting diode is used to indicate both a positive DC polarity and also continuity.

In this circuit, there is no practical way to test the continuity of the solenoid itself. Also, this circuit design requires two batteries with a ground between them and does not distinguish between a positive DC voltage and polarity continuity without switching the probes around and retesting.

SUMMARY OF THE INVENTION

The invention provides a solenoid type voltage, polarity and continuity tester which overcomes the above disadvantages. The tester has a housing, a solenoid operated voltage meter in the housing, a negative polarity indicator, a positive polarity indicator, a continuity indicator, a terminal for connection to each of a pair of test probes, a polarity indication circuit for discriminately energizing said polarity indicators in response to a voltage applied across said probes and a continuity indication circuit for energizing said continuity indicator in response to said probes being placed in electrical contact with one another. The solenoid, the polarity indication circuit and the continuity indication circuit are connected between the terminals so that the continuity indication circuit does not energize the continuity indicator unless the solenoid has continuity. Thereby, each time the continuity of a circuit being tested is positively determined, the continuity of the solenoid is also verified.

In an especially useful form, the indicators include at least three separate indicator lights, one of the lights being for indicating a positive polarity, one of the lights being for indicating a negative polarity, and another of the lights being for indicating continuity. In this manner, continuity and positive and negative polarity can be distinguished from one another without the need for reprobing.

Preferably, the continuity indication circuit includes a battery, and when the negative polarity indicator is on, the battery current is reduced. Therefore, the drain on the battery is reduced when checking voltage levels or polarity.

In one aspect, the solenoid is connected in series with the continuity indication circuit between the terminals, and preferably also with the polarity indication circuit so as to limit current through those circuits. Preferably, the solenoid is connected in series with a battery and a transistor of the continuity indication circuit between the terminals, and a second transistor connected across the resistor is in series with the continuity indicator. This is a cost effective way of providing a circuit which reduces battery drainage when checking voltage levels or polarity.

It is an object of the invention to provide a solenoid type voltage tester which provides an indication of the continuity of the solenoid.

It is another object of the invention to provide a solenoid type voltage, polarity and continuity tester which distinguishes a positive DC voltage from continuity.

It is another object of the invention to provide a solenoid type voltage, polarity and continuity tester which does not require a ground between the batteries.

It is another object of the invention to provide a solenoid type voltage, polarity and continuity indicator in which the drain on the battery is reduced when checking voltages.

These and other objects and advantages of the invention will be apparent from the following detailed description and drawings.

BRIEF DESCRIPTION OF THE DRAWINGS

FIG. 2 is a rear plan view of the tester of FIG. 1 without the probes plugged in and with a bench stand folded-in;

FIG. 3 is a right side plan view of the tester of FIG. 1, the left side plan view being identical to FIG. 3;

FIG. 4 is a top plan view of the tester of FIG. 1;

FIG. 5 is a bottom plan view of the tester of FIG. 1;

DETAILED DESCRIPTION OF THE PREFERRED EMBODIMENTS

Figure 1:
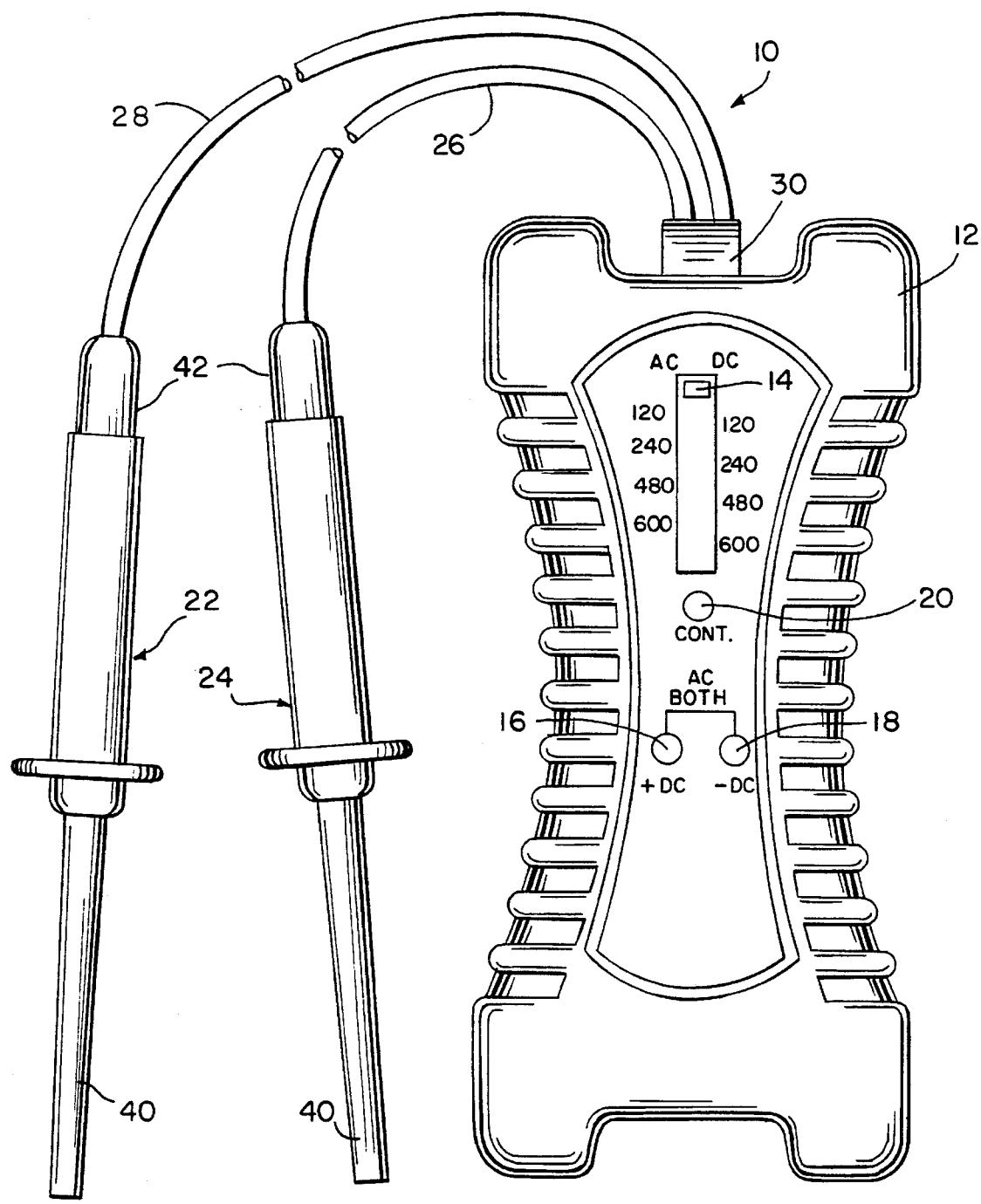
FIG. 1 is a front plan view of a tester of the invention including probes plugged into the tester.

FIGS. 1 through 8 show a solenoid type voltage, polarity and continuity tester 10 of the invention having a housing 12, a voltage indicator 14, a positive DC polarity indicator light emitting diode 16, a negative DC polarity indicator light emitting diode 18, and a continuity indicator light emitting diode 20. The tester 10 also includes probes 22 and 24, which are preferably different colors (e.g., one red and one black) to distinguish between positive and negative.

Figure 8:
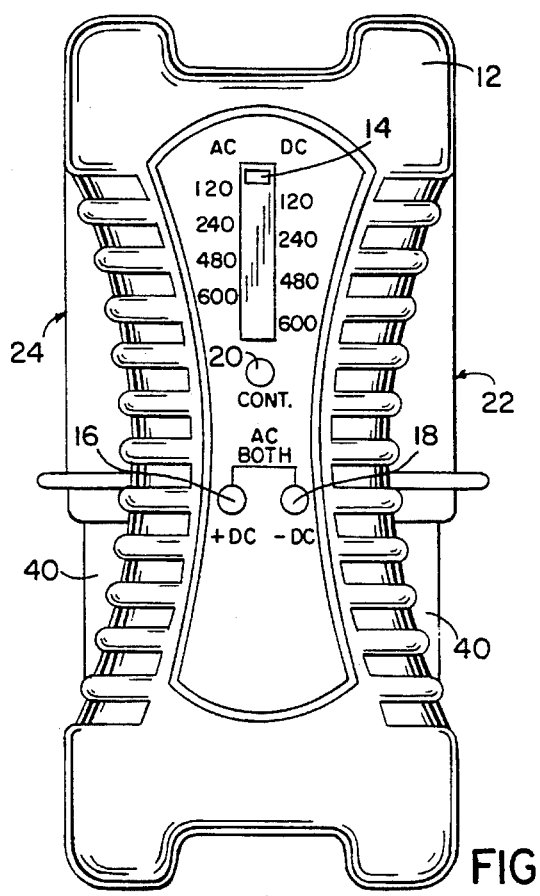
FIG. 8 is a front plan view showing the probes in a storage position.
Figure 8:
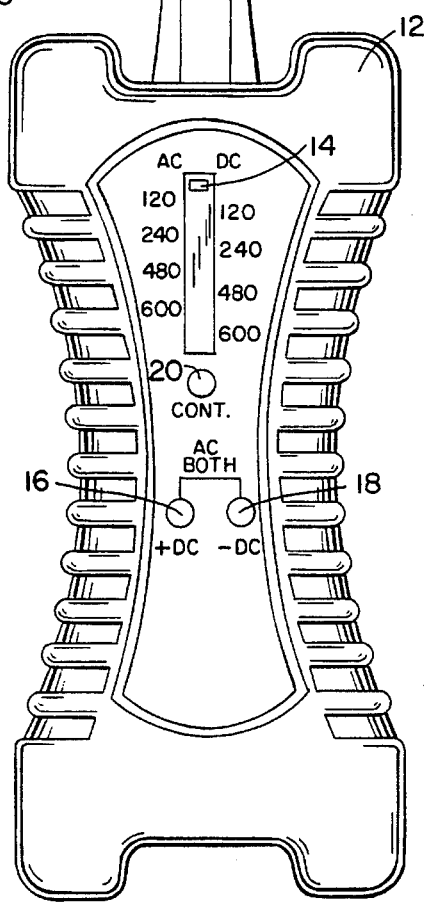

Lead wires 26 and 28 extend from the probes 22 and 24 respectively and terminate in a plug 30 and a mating plug receptacle 32 (FIG. 4) is formed in the top of the housing 12. Inside the receptacle 32 are two terminals 34 and 36 with the terminal 34 making contact with the positive probe 22, 24 and the terminal 36 making contact with the negative probe 22, 24. The probes 22, 24 are of the type having retractable contacts and in which the contacts can be locked in an exposed position to allow probing of a circuit. As shown in FIG. 8, in a storage position the probes 22 and 24 are held along opposite sides of the housing 12 in receptacle holes 38 formed at the top and the bottom of the housing 12. Since the tips 40 of the probes 22 and 24 are spring biased, the tip 40 of each probe 22, 24 can be first placed in a lower hole 38 of the housing 12, the probe depressed, and then the upper end 42 of each probe inserted into the upper hole 38 on the corresponding side of the housing 12 to secure the probes to the housing in a storage position.

At its lower end the housing 12 has a screw type battery door 44 which closes off a battery compartment which preferably houses a pair of 1.5 volt pancake type batteries serially arranged to provide a 3 volt power supply for the continuity indicator part of the tester. The housing 12 is preferably made of molded thermoplastic materials with a front and a rear half and the parting plane between the front and the rear half including the axes of the holes 38. Preferably, the outer layer of the housing is covered at least partially with a soft plastic layer (approx. 50–60 durometer hardness) for impact absorption.

Figure 6:
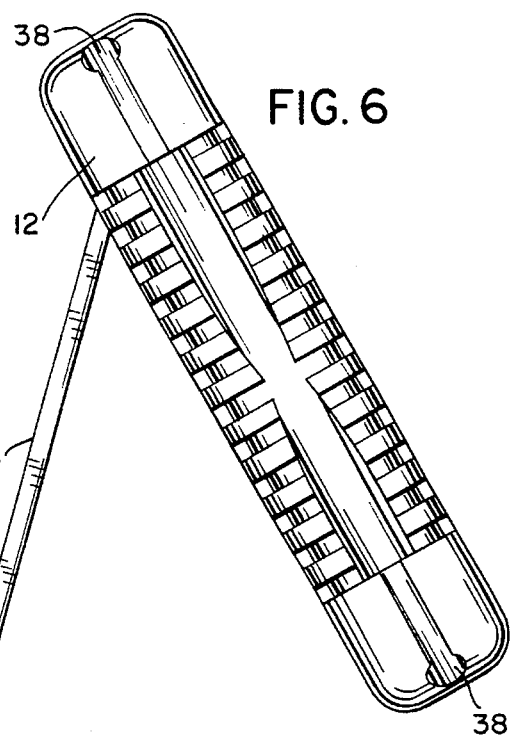
FIG. 6 is a side plan view of the tester of FIG. 1 shown in an inclined position with the bench stand folded out.
Figure 7:
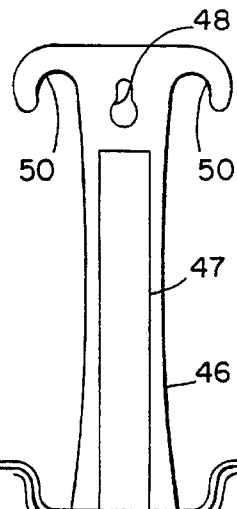
FIG. 7 is a front plan view with the bench stand folded up.

The tester can also include a bench support 46 which is hinged to the upper portion of the rear of the housing 12 and can be folded out at approximately a 45° angle as shown in FIG. 6 so that the tester may be supported on top of a work bench or other support surface. In addition, the bench support is also preferably foldable out 180° from its storage position as shown in FIG. 7 and has a key hole slot 48 at its free end so that the tester can be hung on a nail or peg with its front surface plainly visible. The free end of the bench support 46 also preferably includes hooks 50 at either side to allow the tester to be hung or suspended from them. A magnet 47 may also be provided attached to the rear of the support 46 for temporarily supporting the tester on a metal box, conduit or other metal item, to free the operator's hands for probing and testing. If the support 46 were not provided, the rear surface of the tester could simply be made flat in its central area (or recessed as shown) and a suitably shaped magnet affixed to the rear surface.

Figure 9:
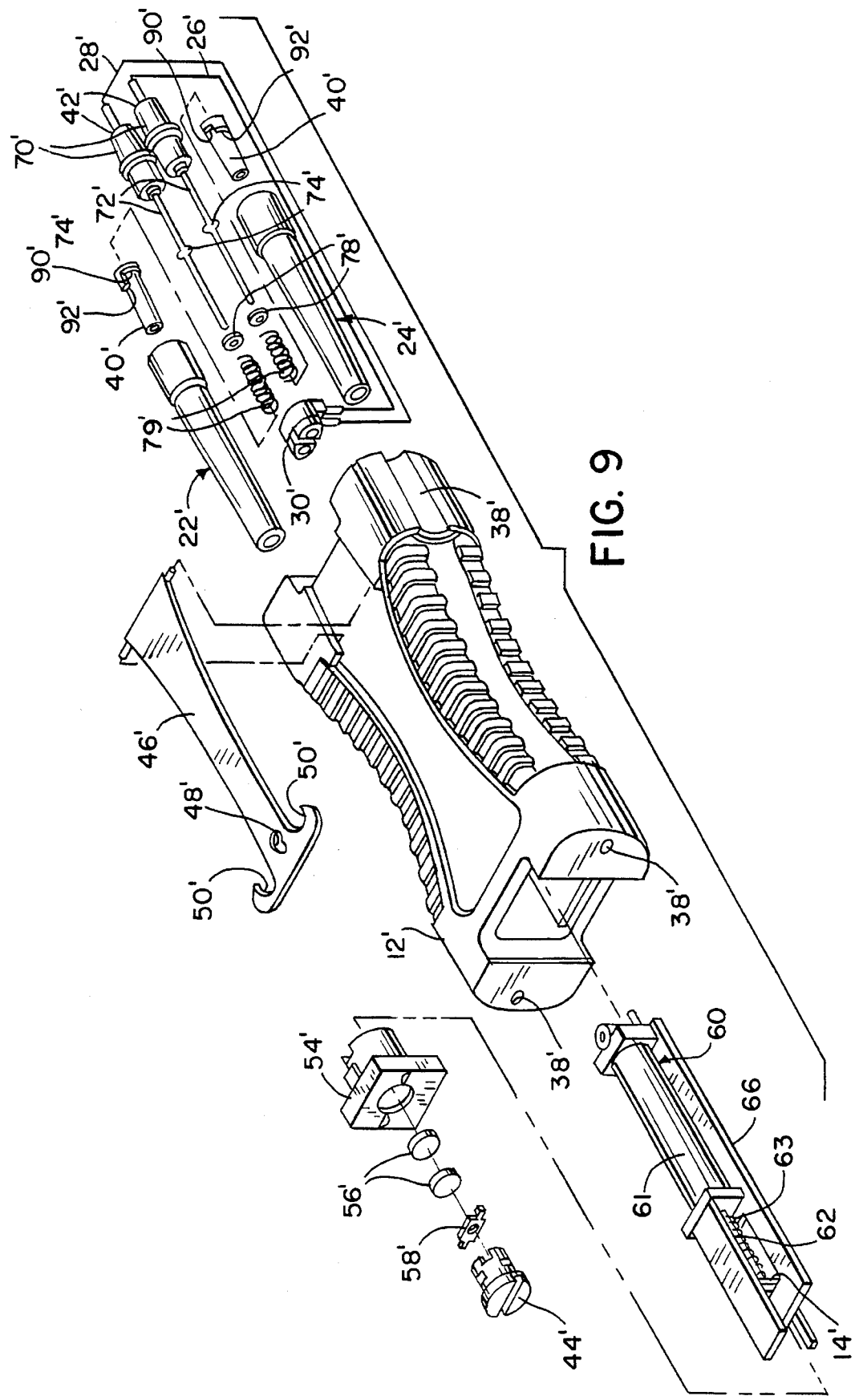
FIG. 9 is an exploded perspective view of a second embodiment of a tester of the invention.

FIG. 9 illustrates a slightly modified tester 10' of the invention and illustrates certain aspects in further detail. Essentially the only differences between the tester 10' and the tester 10 is that the bottom holes 38 are not slotted but are closed and the probes 22 and 24 are of a slightly different outer shape. In FIG. 9, elements corresponding to the elements of the tester 10 are labelled with the same reference number plus a prime (') symbol.

FIG. 9 illustrates a specific construction of probes 22' and 24' in detail and also shows with greater specificity the hinged connection between the bench support 46' and the housing 12' as well as a battery compartment 54 which is secured in the housing 12, batteries 56, battery contacts 58 and battery cover 44'. FIG. 9 also illustrates a solenoid assembly 60 which includes indicator 14' carried by plunger 62 which is slidably received in solenoid coil 61 and biased by compression spring 63 in conventional fashion. The solenoid assembly 60 also includes a printed circuit board assembly 66, the circuit of which is described below with reference to FIG. 10.

As shown in FIG. 9, each probe 22', 24' has a cover 70 at its end 42' with an electrical contact 72' extending from the respective cover and electrically connected by one of the leads 26', 28' to one of the terminals (34, 36 in the tester 10) when the plug 30' is received in the plug receptacle of the tester. A washer 78 is provided around each test pin 72 and bears against a flattened portion 74 formed between the ends of each pin 72. A spring 79 is provided over each test pin 72 and bears against each washer 78 at one end and at its other end biases a probe nozzle 82 into an extended position.

A probe housing 84 is provided over each nozzle 82, spring 79, washer 78 and contact 72 and is secured at its end 86 such as by threads, ultrasonic welding or an adhesive to its respective cover 70. Each housing 84 has a notched flange at its end 88 so that its corresponding nozzle 82, which extends through the end 88, can bear against the flange with surface 90 in an extended position or it can be retracted to bear against the flange at end 88 with surface 92 so that the ends of the test pins 72' are exposed.

Figure 10:
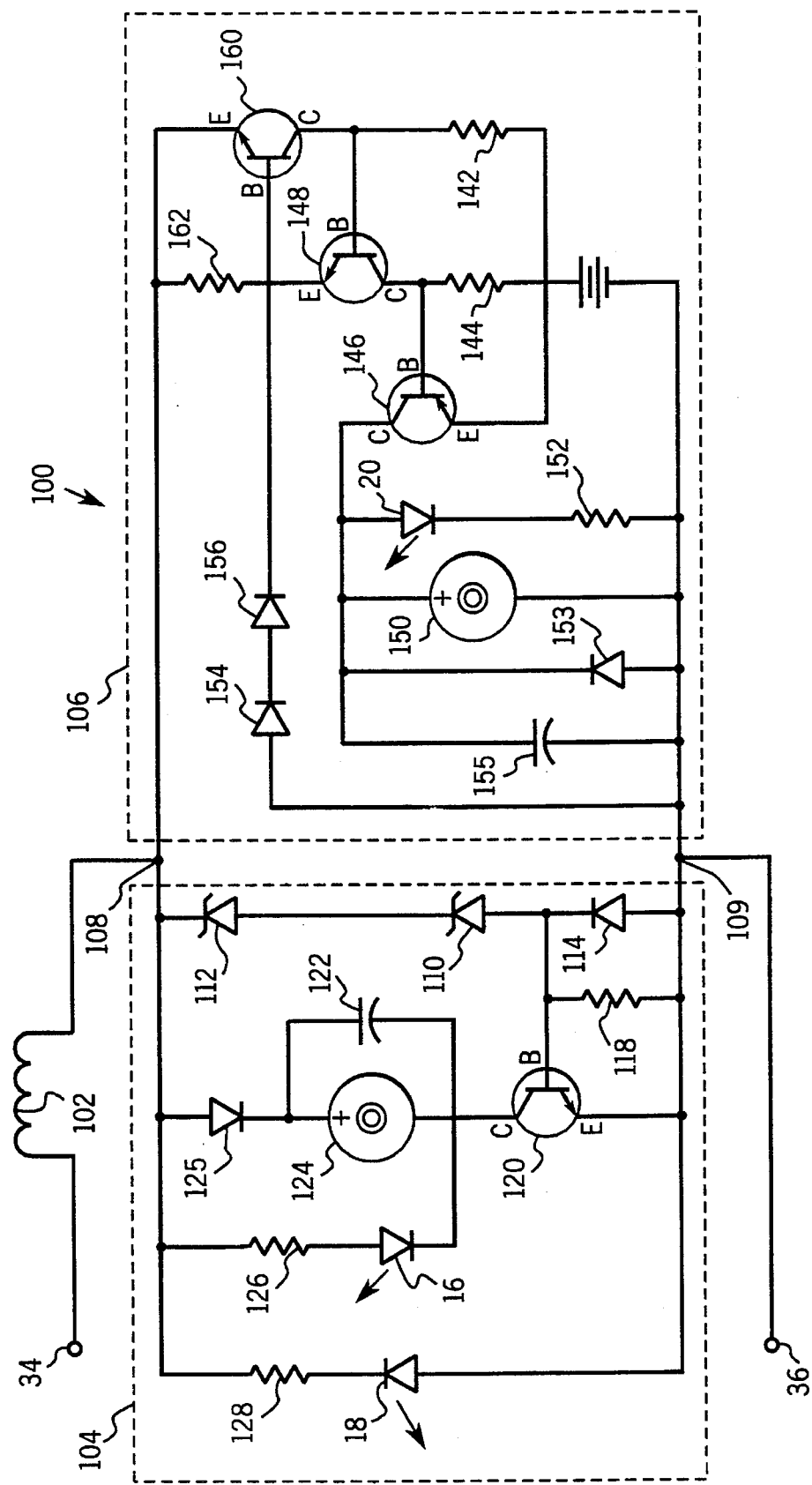
FIG. 10 is a schematic view of a circuit for a tester of the invention.

FIG. 10 is a schematic view of a circuit 100 which can be used for either of the testers 10 or 10'. In the circuit 100, reference numbers are applied as if the circuit is incorporated in the tester 10.

The circuit 100 includes the terminals 34 and 36 and a solenoid coil 102 (61 in the tester 10') in series with the terminals 34 and 36 and with a polarity circuit 104 and a continuity circuit 106. The polarity circuit 104 and the continuity circuit 106 are in parallel with one another, with nodes 108 and 109 between the two circuits.

Between nodes 108 and 109 in the polarity circuit 104, two zener diodes 110 and 112 and a diode 114 are connected in series with one another. The zener diodes 110 and 112 should be identical, each preferably having the same breakdown voltage, leakage characteristics and turn-on characteristics. For example, each diode 110 and 112 may be a 1N4731 zener diode (having a breakdown voltage of 4.3 volts) and the diode 114 may be a 1N4004 diode. Preferably, the solenoid coil 102 (61 in tester 10') has a resistance of 6.6K–6.9K ohms.

In parallel with the diode 114 is a resistor 118 which preferably has a value of 50K ohms. The base and emitter of NPN transistor 120 (e.g., a 2N3904) are also connected in parallel with the diode 114. The collector of transistor 120 is connected to a circuit having a buzzer 124 (e.g., 3100 Hz) in parallel with a capacitor 122 (e.g., 10 µF) and the parallel circuit of the buzzer 124 and capacitor 122 is connected to node 108 through diode 125 (e.g., a 1N4004). A resister 126 preferably having a value of 220 ohms in series with positive polarity indicating LED 16 is also connected between the collector of transistor 120 and node 108. Preferably, LED 16 is green in color when it is on.

Also connected between nodes 108 and 109 is a resistor 128 preferably having a value of 120 ohms in series with the negative polarity indicating LED 18, which is preferably red in color when on.

Now referring to the continuity circuit 106 shown within dashed lines on the right side of FIG. 10, the continuity circuit 106 includes a 3 volt power supply 140, provided by the batteries 56' in the tester 10' or by the same type of battery arrangement in the tester 10. The negative terminal of the power supply 140 is connected to node 109 and the positive terminal of the power supply 140 is connected to two resistors 142 and 144 and to the emitter of a PNP transistor 146 (e.g., a 2N3906 transistor). The resister 142 is preferably a 100K ohm resister and is connected at its opposite end to the base of an NPN transistor 148 (e.g., a 2N3904 transistor) and to the collector of an NPN transistor 160 (e.g., a 2N3904 transistor). The resister 144 is preferably a 33K ohm resister and has its opposite end connected to the base of transistor 146 and to the collector of transistor 148.

The collector of transistor 146 is connected to a parallel circuit having a buzzer 150 (e.g., 2400 Hz) in one branch, the continuity indicating LED 20 in series with a resister 152 (preferably 120 ohms) in another branch, a diode 153 (e.g., a 1N4004) in a third branch and a capacitor 155 (e.g., 0.39 µF) in a fourth branch. As shown, at its end opposite from the collector of transistor 146 this parallel circuit is connected to the node 109.

The continuity circuit 106 also includes two diodes 154 and 156 (both preferably 1N4004 diodes) connected between node 109 and the emitter of transistor 148. The emitter of transistor 148 is also connected to the base of NPN transistor 160 which has its emitter connected to its base through a resister 162 which is preferably 2.3K ohms.

The resister 162 and emitter of transistor 160 are connected to node 108. It should also be noted that a fusible link may be provided between the terminal 36 and the node 109 to provide for circuit protection.

The topology of circuit 100 places the solenoid 102 in series with separate polarity and continuity circuits 104 and 106. The solenoid 102 is in series with both circuits and therefore helps limit the current through them.

Referring first to the continuity circuit 106, the continuity testing function of the circuit is designed to turn on LED 20 when the probes 22 and 24 are placed in electrical contact with one another with a resistance of from 0 to approximately 10k ohms. When so shorted, the base to emitter voltage of transistor 148 becomes greater than +0.7 volts which turns on transistor 148 so that there is a current flowing through resistors 144 and 162 and through the solenoid coil 102. However, transistor 160 is off so there is no current flowing through resistor 142 except for the base current required to turn transistor 148 on.

Turning transistor 148 on creates a negative voltage from the base to the emitter of transistor 146 because of the voltage drop past resistor 144, which is sufficient to turn on transistor 146. Thus, current is allowed to flow through LED 20 and the current limiting resistor 152, which lights LED 20 to indicate continuity. Buzzer 150 is also energized to indicate continuity when transistor 146 turns on. Capacitor 155 and diode 153 are provided to improve sound quality of buzzer 150.

During the continuity testing function, essentially no current is flowing through the polarity circuit 104. The current flows are blocked through the LED 18 and zener diode 110, 112 branches of the polarity circuit and transistor 120 is biased off, with no voltage difference between its base and emitter. Any leakage is insufficient to trip either polarity indicator 16 or 18 at low or no voltage in the line being tested. If the line being tested for continuity has a positive or negative voltage up to approximately 2 volts, the continuity indicator still functions, but the polarity indication circuit does not function at that low level. Above approximately 2 volts, continuity indication ceases and at approximately 5 volts polarity indication starts functioning. Therefore, the preferred embodiment described has a dead band between approximately 2 and 5 volts (positive or negative), where neither continuity nor polarity are indicated. With reference to the circuit 100, the voltage between terminals 34 and 36 is referred to as positive when the voltage at terminal 34 is greater than the voltage at terminal 36.

The preferred embodiment of the polarity circuit 104 responds to a positive or negative voltage at terminal 34 relative to terminal 36 of approximately 5 volts to 600 volts. When applying a positive voltage difference in this range between the terminals 34 and 36, transistor 148 is off (there being a higher voltage at its emitter than at its base) and current is blocked from flowing through diodes 154 and 156. Current is also blocked from flowing through negative indicating LED 18. Zener diodes 110 and 112, however, leak enough to produce a positive voltage difference between the base and emitter of transistor 120 sufficient to turn transistor 120 on so that a current flows through LED 16, which lights LED 16 to indicate a positive polarity. Resistor 118 is provided to bleed off the leakage from the zener diodes 110 and 112 so that transistor 120 is not turned on until approximately +5 volts between terminals 34 and 36. Buzzer 124 is also energized to indicate a positive polarity when transistor 120 turns on.

When a voltage of a negative polarity between approximately 5 volts and 600 volts is applied between terminals 34 and 36, a current flows through diodes 154 and 156. This current flows through resistor 162 which produces a positive voltage from the base to the emitter of transistor 160 which turns transistor 160 on. Turning transistor 160 on turns transistor 148 off. Turning transistor 148 off also turns off transistor 146 since there would be no voltage difference between the base and emitter of transistor 146.

A negative voltage at terminal 34 of approximately 5 to 600 volts also causes a current through resistor 128 and LED 18 and a current through diode 114 and the two zener diodes 110 and 112. The voltage drop across diode 114 and the two zener diodes 110 and 112 (approximately 2.1 volts) is sufficient to light LED 18.

Preferred embodiments of the invention have been described in considerable detail. Numerous modifications and variations to the invention will be apparent to those of ordinary skill in the art. Therefore, the invention should not be limited to the embodiments described, but should be defined by the claims which follow.

We claim:

1. A solenoid type voltage, polarity and continuity tester, comprising:

a housing;

a voltage meter in said housing, said meter having a solenoid and an indicator which is visible by a user of said tester;

a negative polarity indicator in said housing, said indicator being visible to a user of said tester;

a positive polarity indicator in said housing, said indicator being visible to a user of said tester;

a continuity indicator in said housing, said indicator being visible to a user of said tester;

a pair of test probes;

a pair of terminals, each of said terminals being for connection to a separate one of said test probes;

a polarity indication circuit for discriminately energizing said polarity indicators in response to a voltage applied across said probes; and a continuity indication circuit for energizing said continuity indicator in response to said probes being placed in electrical contact with one another;

wherein said solenoid, said polarity indication circuit and said continuity indication circuit are connected between said terminals so that said continuity indication circuit does not energize said continuity indicator unless said solenoid has continuity.

2. A solenoid type voltage, polarity and continuity tester as in claim 1, wherein said polarity and continuity indication circuits are connected in parallel with one another.

3. A solenoid type voltage, polarity and continuity tester as in claim 1, wherein said indicators include at least three separate indicator lights, one of said lights being for indicating a positive polarity, one of said lights being for indicating a negative polarity, and another of said lights being for indicating continuity.

4. A solenoid type voltage, polarity and continuity tester as in claim 1, wherein said continuity indication circuit includes a battery, and wherein when said negative polarity indicator is on, said battery is switched into a circuit having a resistance to current flow through said battery which is greater than the resistance to current flow through said battery when the continuity indicator is on.

5. A solenoid type voltage, polarity and continuity tester as in claim 1, wherein said solenoid is connected in series with said continuity indication circuit between said terminals.

6. A solenoid type voltage, polarity and continuity tester as in claim 5, wherein said solenoid is connected in series with a battery and a transistor of said continuity indication circuit between said terminals.

7. A solenoid type voltage, polarity and continuity tester as in claim 6, wherein said continuity indication circuit further includes a second transistor, said second transistor being connected across said resistor and wherein said second transistor is connected in series with said continuity indicator.

8. A solenoid type voltage, polarity and continuity tester as in claim 1, wherein said solenoid is connected in series with said continuity indication circuit and with said polarity indication circuit between said terminals.

* * * * *